United States Patent [19]
Nagarajan et al.

[11] Patent Number: 6,133,064
[45] Date of Patent: Oct. 17, 2000

[54] FLIP CHIP BALL GRID ARRAY PACKAGE WITH LAMINATED SUBSTRATE

[75] Inventors: Kumar Nagarajan; Kishor Desai, both of Fremont, Calif.

[73] Assignee: LSI Logic Corporation, Milpitas, Calif.

[21] Appl. No.: 09/322,064

[22] Filed: May 27, 1999

[51] Int. Cl.[7] .......................... H01L 21/44; H01L 21/48; H01L 21/50

[52] U.S. Cl. ......................... 438/106; 438/107; 438/127

[58] Field of Search ................................. 438/106, 107, 438/108, 127

[56] References Cited

U.S. PATENT DOCUMENTS

| | | |
|---|---|---|
| 5,473,814 | 12/1995 | White . |
| 5,767,575 | 6/1998 | Lan et al. . |
| 5,920,126 | 7/1999 | Sohara . |

*Primary Examiner*—Kevin M. Picardat
*Assistant Examiner*—D. Mark Collins

[57] ABSTRACT

Methods and apparatus pertaining to flip chip ball grid array packages are disclosed. A substrate comprises a base layer with a dielectric laminated thereon such that a cavity in the dielectric exposes the base layer. A die is then mounted to the exposed portion of the base layer. Preferably, an upper portion of the dielectric forms a frame for receiving a heat spreader.

6 Claims, 2 Drawing Sheets

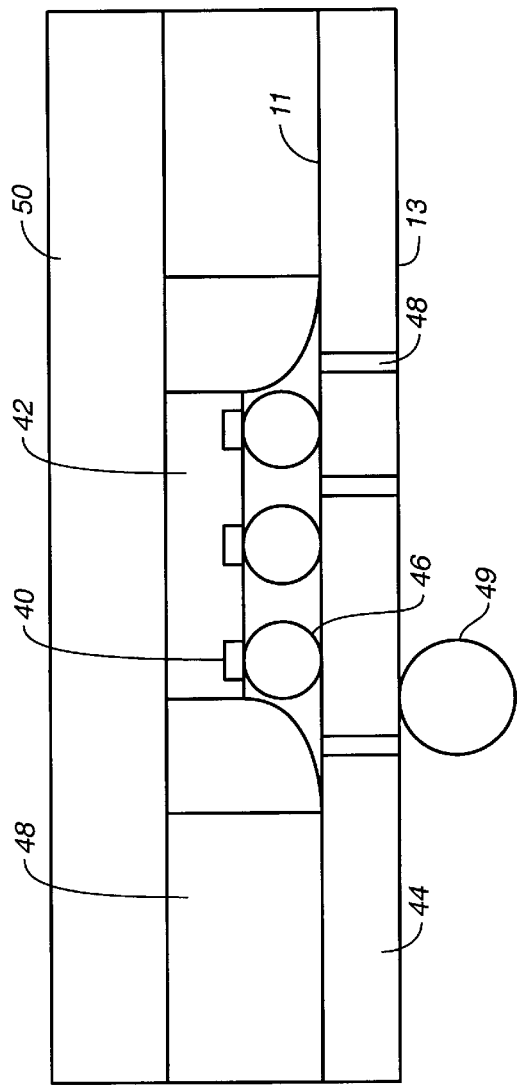
FIG._1
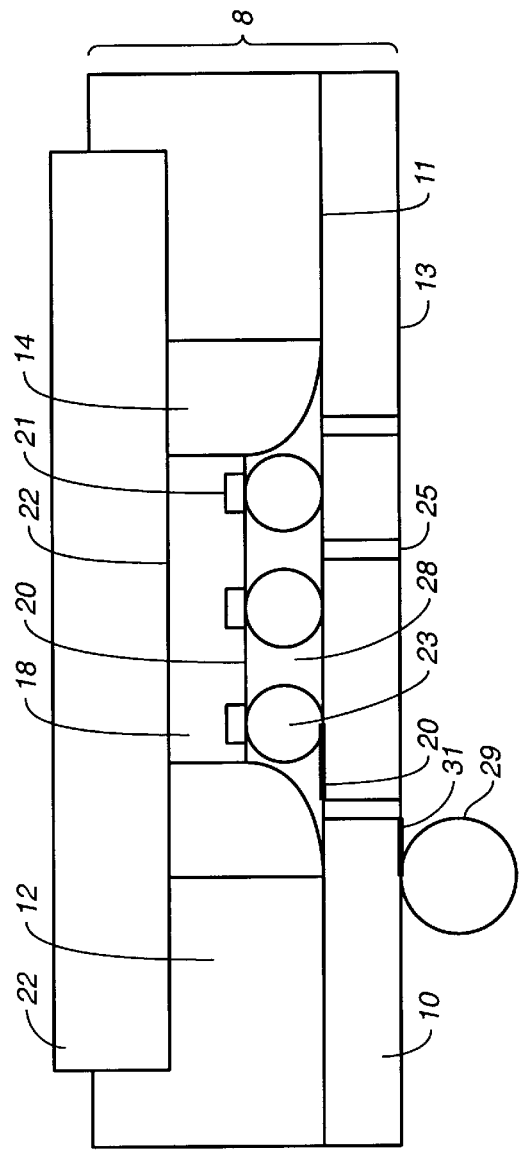
FIG._2

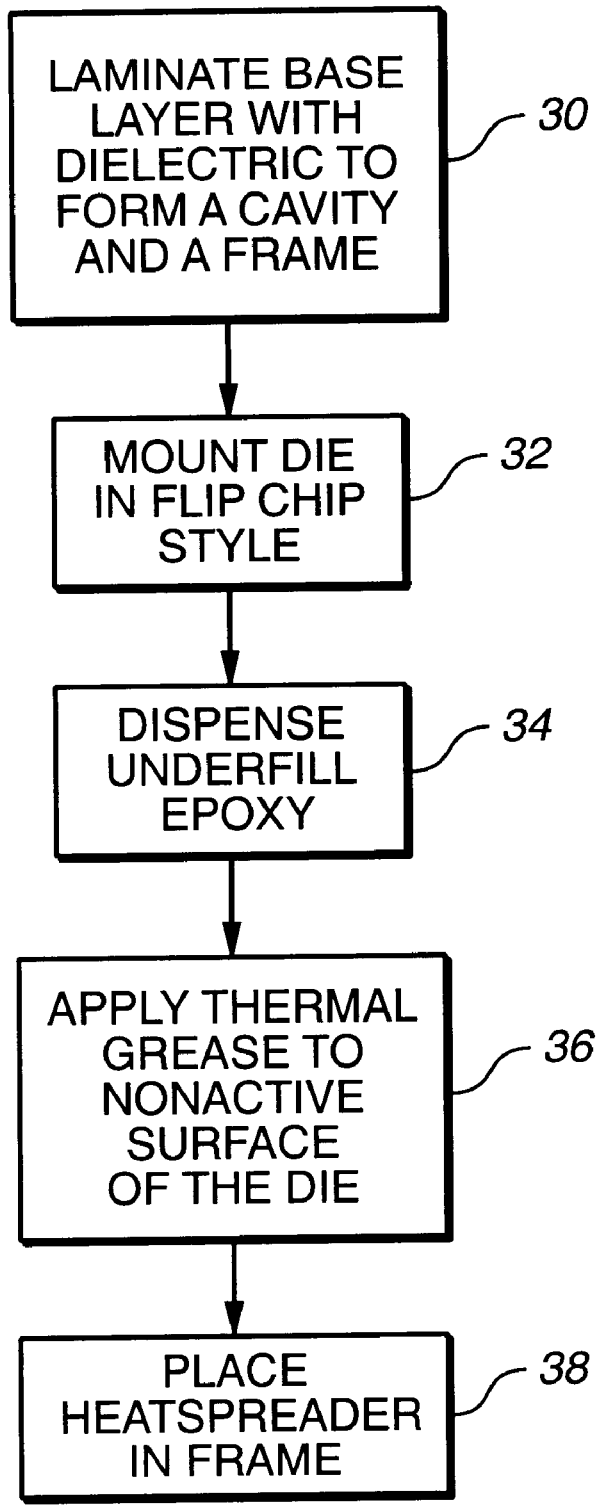
FIG._3

FLIP CHIP BALL GRID ARRAY PACKAGE WITH LAMINATED SUBSTRATE

BACKGROUND OF THE INVENTION

1. Field of the Invention

This invention relates to the packaging of semiconductor devices, and in particular to a flip chip ball grid array package and a method for creating a flip chip package.

2. Description of the Related Art

Flip chip ball grid array packages are becoming increasingly popular due to the ever increasing demands for higher pin counts. An example of a prior art flip chip ball grid array package is illustrated in FIG. 1. As shown, bond pads 40 on a die 42 are electrically coupled to a substrate 44 by bumps 46. The substrate 44 comprises electrically conductive vias 48, which are often created by lasers, that electrically couple the bond pads 40 to solder balls 49. In turn, solder balls serve to electrically couple the package to a printed circuit board. A stiffener 48 helps prevent warpage of the substrate 44 and also serves to support a heat spreader 50.

To create the package shown in FIG. 1, the entity performing the packaging will mount the die 42 to the substrate 44 and dispense the underfill epoxy. Thereafter, the stiffener 48 is mounted to the substrate 44 and finally, the heat spreader 50 is mounted to the stiffener 48.

There are various drawbacks to the assembly procedure described above. First since the current trend in substrate manufacturing is towards denser substrates with thinner outlines, it is difficult to manufacture a substrate with a small amount warpage. A relatively large amount of substrate 44 warpage, especially in the die 42 area, results in the die bumps 46 not mating properly with pads on the substrate 44, which in turn may result in an open joint. Also, CTE mismatch between the die 42 and the substrate 44 after the underfill epoxy has been dispensed causes both the substrate 44 and the die 42 to warp. Such warpage is a critical aspect of the assembly process since it governs the coplanarity of the package and, as previously mentioned, affects interconnections between the substrate 44 and the die 42. Second, aligning the stiffener 48 and heatspreader 50 with the substrate 44 to within the current JEDEC standard (+/–0.2 mm) is difficult because the stiffener 48 and heatspreader 50 move on top of the epoxy when it is cured. Tooling such as boat required to align the stiffener 48 and heatspreader 50 during the curing of epoxy cure is unreliable.

The foregoing attachment problems result in poor yields during the solder ball attach process because the ball fluxing and placement are referenced from the edge of the package and if the edge of the package has a wider tolerance than the ball pad, then the flux is not registered on the ball pad and leas to a non-wet solder ball. Also, the misalignment causes a poor fit for the test sockets and has resulted in test yield losses.

SUMMARY OF THE INVENTION

The foregoing limitations are solved by providing a substrate comprising a base layer with a dielectric laminated thereon such that a cavity in the dielectric exposes the base layer. A die is then mounted to the exposed portion of the base layer. The dielectric layer helps to prevent warpage of the die and the substrate during the mounting of the die. Preferably, an upper portion of the dielectric forms a frame for receiving a heat spreader. This frame helps make heatspreader placement more accurate.

BRIEF DESCRIPTION OF THE DRAWINGS

Other objects and advantages of the invention will become apparent upon reading the following detailed description and upon reference to the accompanying drawings in which:

FIG. 1 illustrates a prior art flip chip ball grid array package.

FIG. 2 shows a cross section of a flip chip BGA package according to an embodiment of the present invention.

FIG. 3 is a flow chart describing one possible method of creating a flip chip ball grid array package according to the present invention.

In some of the drawings, for purposes of illustration, only one of a plurality of referenced items is shown. Similarly, in other cases, a drawing may show only a few of the actual number of items.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 2 shows a cross section of a flip chip BGA package according to an embodiment of the present invention. As shown, a substrate 8 comprises a base layer 10, with a top surface 11 and a bottom surface 13, and a dielectric 12, preferably comprising BT resin, laminated on the top surface 11 of the substrate. The dielectric 12 defines a cavity 14 which exposes the base layer 10. The dielectric 12 also defines a frame 16. A die 18 with an active surface 20, which has a plurality of bond pads 21 thereon, and a non-active surface 22 is mounted within the cavity 14 on the base layer 10 such that the active surface 20 of the die 18 faces the base layer 10. A first plurality of solder balls 29 serves to mount the package to a printed circuit board.

Each of a second plurality of solder balls 23 electrically couples a corresponding one of the plurality of bond pads 21 to a corresponding one of a plurality of traces 20 on the top surface 11 of the base layer 10. Each of a plurality of vias 25 electrically couples one of the traces 20 to one of the first plurality of solder balls 29. Each of a plurality of short traces 31 on the bottom surface 13 of the base layer 10 are preferably used to connect one of the plurality of vias 25 with a corresponding one of the first plurality of solder balls 29.

A heatspreader 22 is set in the frame 16 and rests upon the dielectric 12 and (either directly or through a substance which may be thermal grease) the non-active surface 22 of the die 18. Underfill epoxy 28 helps seal the die 18 to the substrate 8.

FIG. 3 is a flow chart describing one possible method of creating a flip chip ball grid array package according to the present invention. As shown in block 30, the base layer 10 of the substrate 8 is laminated with the dielectric 12 such that the dielectric 12 defines the cavity 14 and the frame 16. Preferably, the lamination is performed on a substrate panel form and the panel is then sawed into individual substrates such as substrate 8.

In block 32, the die is mounted within the cavity on the substrate such that the active surface of the die 18 faces the base layer 10 and electrically couples the die 18 to the substrate 8 (i.e. flip chip style). Preferably, this electrical coupling is accomplished through the placement and reflow of the second plurality of solder balls 23 between the traces 20 and the plurality of bond pads 21. In block 34, the underfill epoxy 28 is dispensed. In block 36, thermal grease or the like is applied to the non-active surface 22 of the die 18 and in block 38, the heatspreader 22 is then placed in the frame, resting upon the dielectric 12 and (through the thermal grease) the non-active surface 22 of the die 18.

Numerous variations and modifications will become apparent to those skilled in the art once the above disclosure is fully appreciated. It is intended that the following claims be interpreted to embrace all such variations and modifications.

What is claimed is:

1. A method for manufacturing a package for mounting a semiconductor device to a circuit board, the method comprising the steps of:

providing a substrate comprising a base layer with a top surface and a bottom surface;

laminating a dielectric on the top surface of the base layer such that a cavity in the dielectric exposes the top surface of the base layer;

placing a die at least partially within the cavity, wherein the die comprises an active surface and a non-active surface, the active surface having a plurality of bond pads thereon;

after the step of placing the die at least partially within the cavity, mounting the die on the top surface of the base layer such that the active surface of the die faces the top surface of the base layer; and electrically coupling at least one of the plurality of bond pads with a solder ball disposed on the bottom surface of the base layer.

2. The method of claim 1 wherein the dielectric is laminated such that an upper portion of the dielectric forms a frame and wherein the method further comprises the step of placing a heatspreader within the frame such that the heat spreader rests on the dielectric.

3. The method of claim 1 wherein the top surface of the base layer comprises a plurality of traces.

4. The method of claim 3 further comprising the step of disposing each of a plurality of solder balls between a corresponding one of the plurality of bond pads and a corresponding one of the plurality of traces.

5. The method of claim 1 wherein each of a plurality of conductive vias connect the top surface of the base layer with a corresponding one of a plurality of solder balls disposed on the bottom surface of the base layer.

6. The method of claim 5 wherein the top surface of the base layer comprises a plurality of traces, each of the plurality of traces electrically coupling one of the bond pads with a corresponding one of the plurality of conductive vias.

* * * * *